(12) United States Patent
Yang et al.

(10) Patent No.: US 8,248,105 B2
(45) Date of Patent: Aug. 21, 2012

(54) SMART EDGE DETECTOR

(75) Inventors: Shu-Chun Yang, Xihu Township (TW);
 Jinn-Yeh Chien, Chu Bei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 208 days.

(21) Appl. No.: 12/706,058

(22) Filed: Feb. 16, 2010

(65) Prior Publication Data
 US 2011/0199121 A1   Aug. 18, 2011

(51) Int. Cl.
 *H03K 5/22* (2006.01)
(52) U.S. Cl. ............... 327/24; 327/38; 327/69; 327/141
(58) Field of Classification Search ............... 327/2–99, 327/141, 144–163
 See application file for complete search history.

(56) References Cited

U.S. PATENT DOCUMENTS

| | | | | |
|---|---|---|---|---|
| 5,949,263 A * | 9/1999 | Marie | | 327/156 |
| 7,071,738 B1 * | 7/2006 | Nguyen et al. | | 327/99 |
| 7,791,377 B2 * | 9/2010 | Kim et al. | | 327/2 |
| 7,898,309 B1 * | 3/2011 | Dogan | | 327/175 |
| 8,069,363 B2 * | 11/2011 | Roth et al. | | 713/400 |
| 2003/0068000 A1 * | 4/2003 | Warren | | 375/355 |
| 2004/0095170 A1 * | 5/2004 | Sugimoto et al. | | 327/141 |
| 2006/0145741 A1 * | 7/2006 | Panpalia et al. | | 327/158 |
| 2008/0054977 A1 * | 3/2008 | Matsumoto | | 327/294 |
| 2008/0074162 A1 * | 3/2008 | Hsu | | 327/205 |

* cited by examiner

*Primary Examiner* — Lincoln Donovan
*Assistant Examiner* — Brandon S Cole
(74) *Attorney, Agent, or Firm* — Lowe Hauptman Ham & Berner, LLP

(57) ABSTRACT

In some embodiments related to a smart edge detector, the smart edge detector uses a second clock in a receiver domain (e.g., clock CLK_D2) to trigger a first flip-flop having a first clock in a transmitter domain (e.g., clock CLK_D1) as input data for the first flip-flop. The clock CLK_D2 through a delay cell also triggers a second flip-flop having the same clock CLK_D1 as input data for the second flip-flop. Based on the output of the first flip-flop (e.g., output S1) and of the second flip-flop (e.g., output S2), the embodiments determine whether the rising and or falling edge of clock CLK_D2 should be used for triggering in a transmitting and receiving application. The embodiments are applicable in both situations where the rising edge or falling edge of clock CLK_D1 is used as a triggering edge. Other embodiments are also disclosed.

16 Claims, 20 Drawing Sheets

|  | (1) | (2) |
|---|---|---|
| S1 / S2 | L | H |
| L | F | R |
| H | F | R |

Fig. 7    700

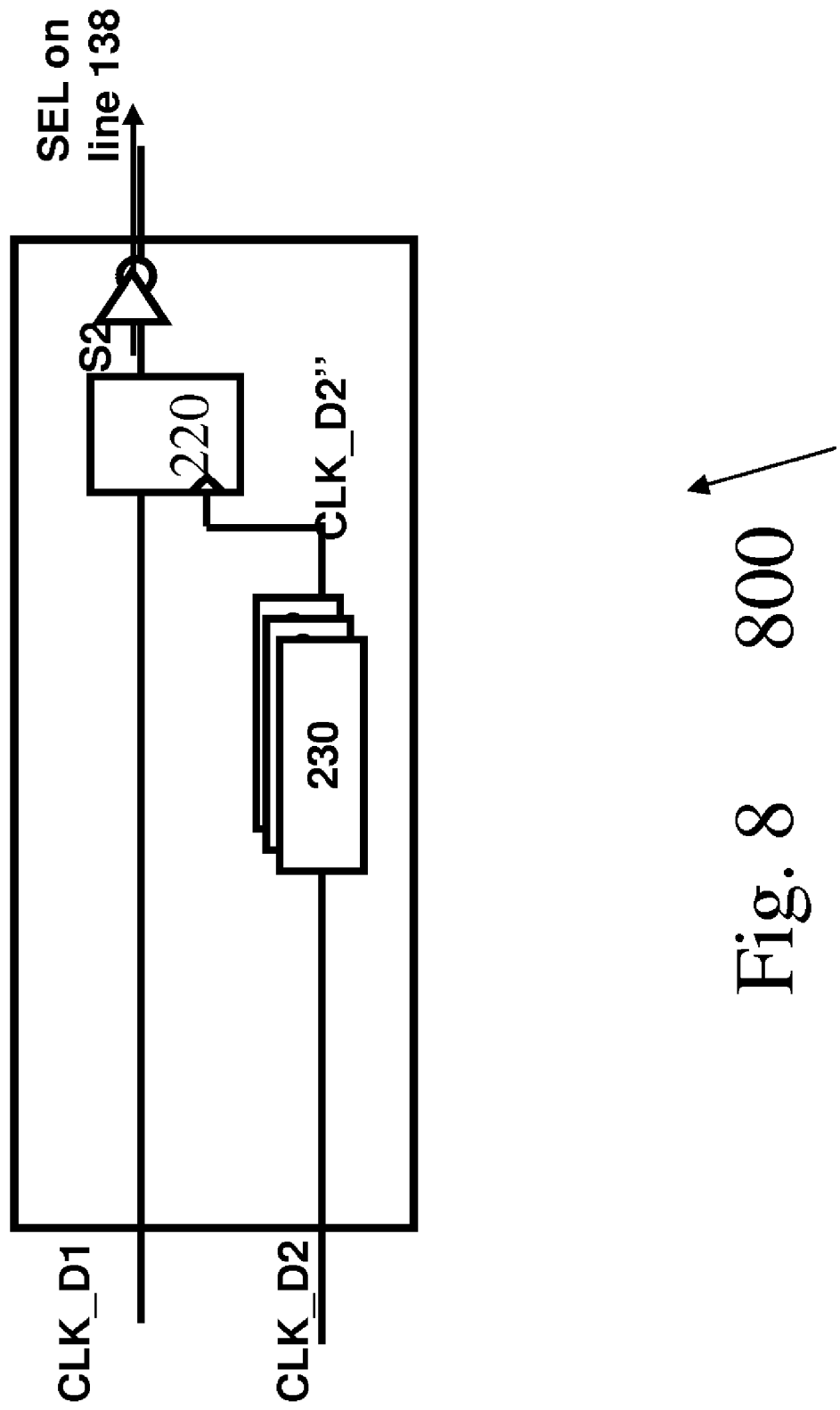
Fig. 8    800

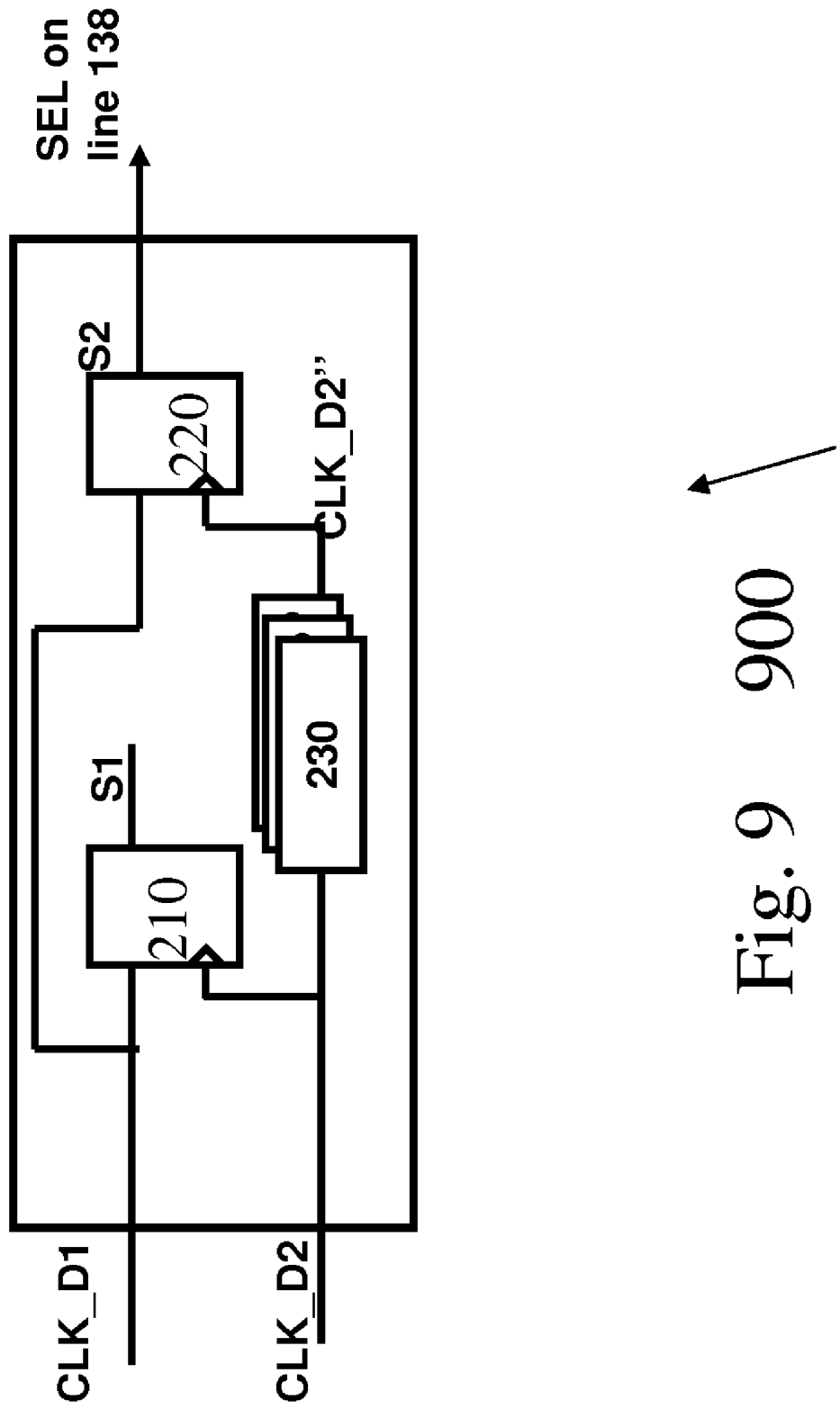
Fig. 9    900

|   |   |   |
|---|---|---|
| H | L | S1 / S2 |
| R | R | L |
| F | F | H |

Fig. 14  1400

SMART EDGE DETECTOR

FIELD

The present disclosure is generally related to integrated circuits, and, in various embodiments, is related to a smart edge detector.

BACKGROUND

Clock signals are commonly used in integrated circuits. Dual clocks or dual clock domains can result in un-synchronizations and meta-unstability. Clocks in two different chips can be skewed by various factors including, for example, packaging, routing, connections, etc., that can be part of and/or worsen un-synchronization. To minimize data loss and meta-unstability of clock un-synchronization, some approaches use both the rising and falling edges of a clock for triggering, and switch between these triggering edges as appropriate. Those approaches, however, require a control pin for such switching, which needs to be calibrated from time to time, and is therefore undesirable.

BRIEF DESCRIPTION OF THE DRAWINGS

The details of one or more embodiments are set forth in the accompanying drawings and the description below. Other features and characteristics of the embodiments will be apparent from the description, drawings, and claims.

FIG. 7 is a truth table summarizing how some embodiments select an edge of clock CLK_D2 for triggering when clock CLK_D1 uses its falling edge for triggering.

FIG. 8 is a schematic diagram of the edge detector 130 in accordance with a second embodiment in which clock CLK_D1 uses its falling edge for triggering and the select signal SEL is independent of signal S1.

FIG. 9 is a schematic diagram of the edge detector 130 in accordance with a third embodiment in which clock CLK_D1 uses its rising edge for triggering and both signals S1 and S2 are generated.

FIG. 14 is a truth table summarizing how some embodiments select an edge of clock CLK_D2 for triggering when clock CLK_D1 uses its rising edge for triggering.

Like reference symbols in the various drawings indicate like elements.

DETAILED DESCRIPTION

Figure 1:
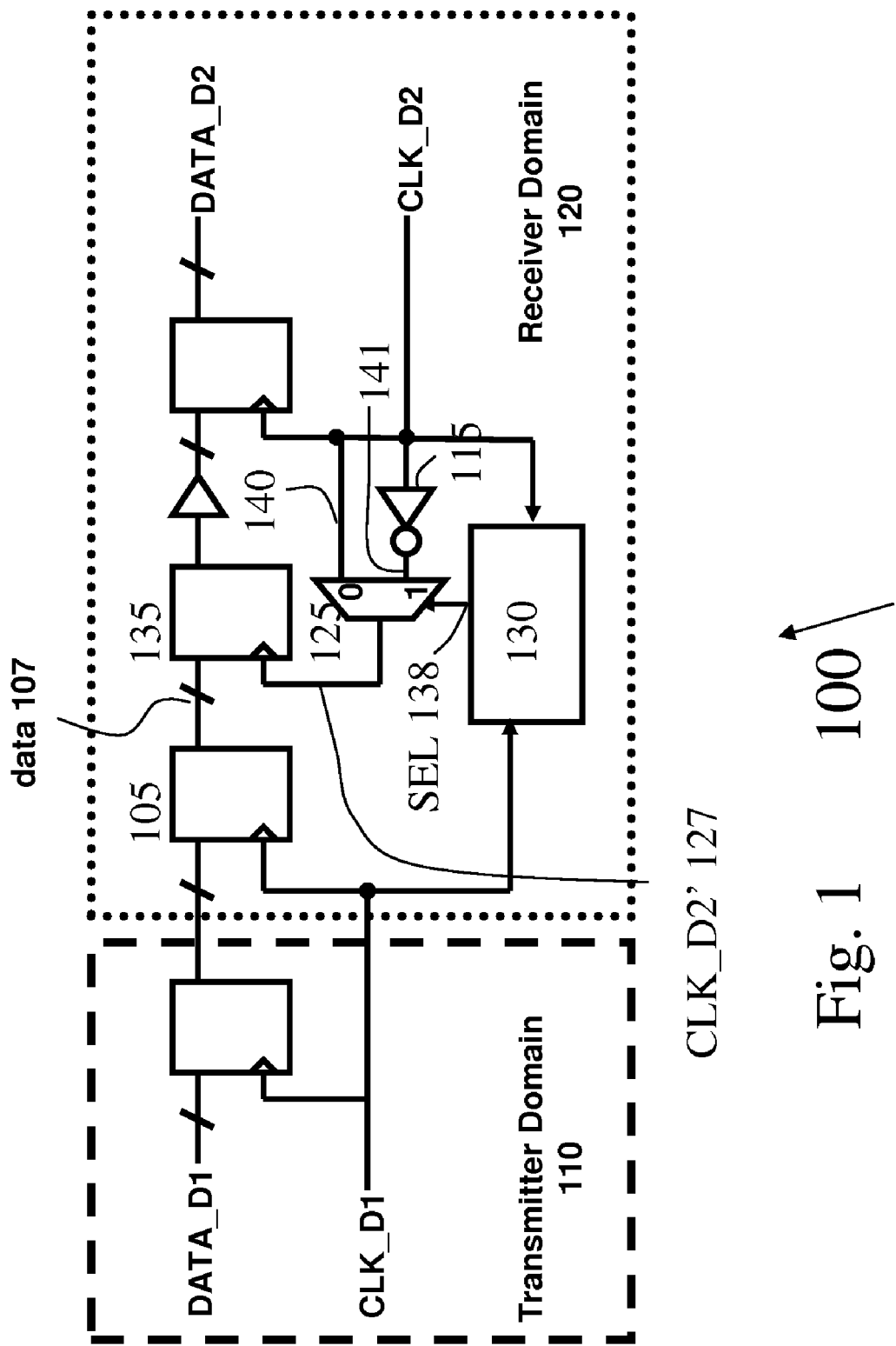
FIG. 1 is a schematic diagram of an illustrated circuit utilizing some embodiments.

Embodiments, or examples, illustrated in the drawings are now being described using specific language. It will nevertheless be understood that the embodiments and examples are not intended to be limiting. Any alterations and modifications in the described embodiments, and any further applications of principles described in this document are contemplated as would normally occur to one of ordinary skill in the pertinent art. Reference numbers may be repeated throughout the embodiments, but this does not necessarily require that feature(s) of one embodiment apply to another embodiment, even if they share the same reference number.

Some embodiments can have one or a combination of the following features and/or advantages. Because some embodiments use one clock (e.g., clock CLK_D2) in one domain to trigger the other clock (e.g., clock CLK_D1) in another domain, those embodiments can detect the timing relationship between these two clocks CLK_D1 and CLK_D2 in two different domains. Some embodiments automatically switch between the two edges of a triggering clock, provide an architecture in a dual clock system to prevent data loss and meta-unstability without using a control pin, and are suitable for inter-chip or chip-to-chip communication. Some embodiments provide advantages over other approaches without affecting layout size or power consumption.

In some embodiments related to a smart edge detector, the smart edge detector uses a second clock in a receiver domain (e.g., clock CLK_D2) to trigger a first flip-flop having a first clock in a transmitter domain (e.g., clock CLK_D1) as input data for the first flip-flop. The clock CLK_D2 through a delay cell also triggers a second flip-flop having the same clock CLK_D1 as input data for the second flip-flop. Based on the output of the first flip-flop (e.g., output S1) and of the second flip-flop (e.g., output S2), embodiments determine whether the rising and/or falling edge of clock CLK_D2 should be used for triggering in some transmitting and receiving applications. Embodiments are applicable in both situations where the rising edge or falling edge of clock CLK_D1 is used as a triggering edge.

Illustrative Circuit Embodiment

FIG. 1 is a schematic diagram of an illustrative circuit 100 that use some embodiments.

In this illustration, a first clock domain, e.g., transmitter domain 110 uses a first clock, e.g., clock CLK_D1 and a second clock domain, e.g., receiver domain 120 uses a second clock, e.g., clock CLK_D2. In some embodiments, transmitter domain 110 includes a PCS (Protocol Code Sub-block) while the receiver domain 120 includes a PMA (Physical Medium Attachment). Embodiments of the disclosure provide mechanisms to realize the edge relationship between clocks CLK_D1 and CLK_D2, regardless of whether the two clock domains are within a chip or from different chips. In various embodiments, because clock CLK_D1 arrives from transmitter domain 110 different from the receiver domain 120, the phase of clock CLK_D1 is not known/controllable in receiver domain 120. As a result, detecting the edge relationship between clocks CLK_D1 and CLK_D2 helps synchronize the two clocks CLK_D1 and CLK_D2 and thus prevent data loss and meta-unstabilities.

Clock CLK_D1 provides a clock signal to trigger flip-flop 105, and depending on applications, the trigger edge could be rising or falling. Edge detector 130, based on the detected conditions/relationships between clock CLK_D1 and CLK_D2, provides a select signal SEL on line 138 to automatically select a triggering edge for clock CLK_D2, which is reflected on clock CLK_D2' on line 127 to trigger flip-flop 135. In various embodiments, if the rising edge of clock CLK_D2 is selected, clock CLK_D2 is selected through multiplexer (e.g., mux) 125 to form clock CLK_D2', but if the falling edge of clock CLK_D2 is selected, clock CLK_D2 is inverted by inverter 115 before being selected by mux 125.

In this disclosure, data on line 107, clock CLK_D1 and clock CLK_D2 run at the same frequency. Setup time Tsetup refers to the time period during which data on line 107 is expected to be available before the active edge of clock CLK_D2' on line 127, and hold time Thold is the time period during which data on line 107 is expected to remain valid after the active edge of clock CLK_D2'. Various embodiments configure sufficient setup time Tsetup and hold time Thold for clock CLK_D2'. As a result, flip-flop 135 functions properly, i.e., without data loss or meta-unstabilities.

Edge Detector Circuit Embodiments Using a
Flip-Flop and a Delay Element

Figure 2:
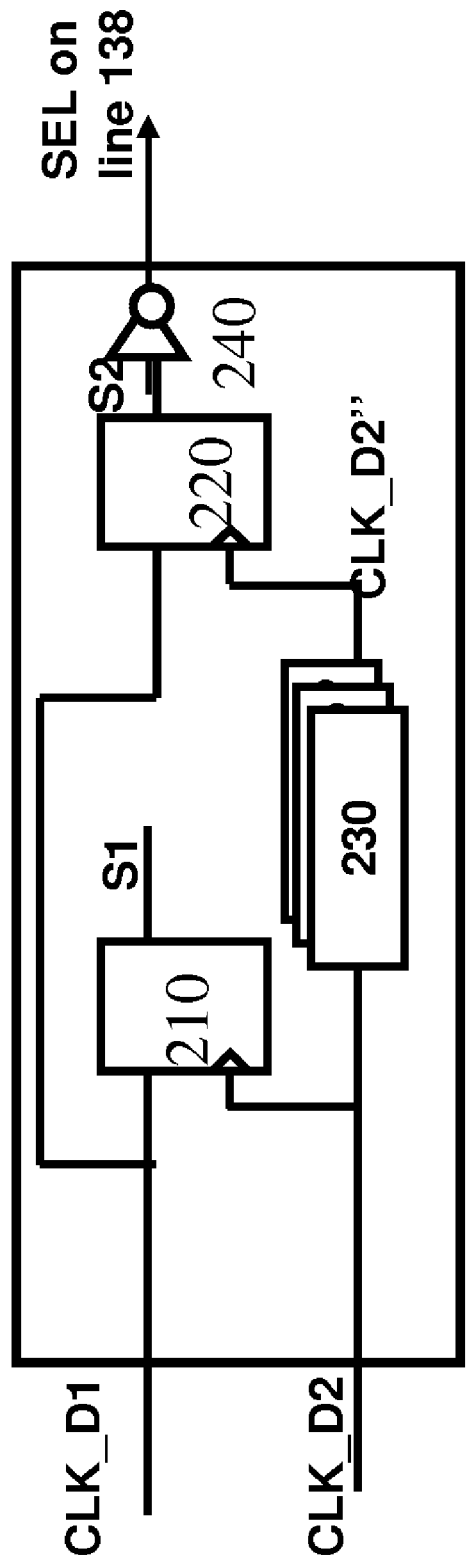
FIG. 2 is a schematic diagram of the edge detector 130 in accordance with a first embodiment in which clock CLK_D1 uses its falling edge for triggering and both signals S1 and S2 are generated.

FIG. 2 is a schematic diagram of an edge detector 200 illustrating in detail edge detector 130 in accordance with a first embodiment when clock CLK_D1 uses its falling edge to trigger flip-flop 105.

Delay cell 230 delays signal CLK_D2 by a delay time (e.g., delay time D) to form clock CLK_D2". In at least some embodiments, an appropriate delay time D is selected to ensure clock CLK_D2 provides clock CLK_D2", which in turn provides signal SEL to select clock CLK_D2' from clock CLK_D2 (FIG. 1) in such a way that clock CLK_D2' has sufficient setup time Tsetup and hold time Thold. In various embodiments, delay time D is configured greater than the hold time of flip-flop 105 (e.g., time Thold 105) plus a predetermined delay time (e.g., time Tjitter) to compensate for any jitter arisen from clock CLK_D2. Depending on situations, the jitter may require a larger hold time Thold 105 for flip-flop 135 to function properly. Time Tjitter can be determined by various mechanisms including, for example, simulations. For illustration, time Tjitter is 0.

Flip-flop 210 receives clock signal CLK_D1 as data and clock signal CLK_D2 as a clock, and generates signal S1 That's right & why they have the other embodiments. Flip-flop 220 receives clock signal CLK_D1 as data and clock signal CLK_D2" as a clock, and generates signal S2. Clock CLK_D2" is the same as clock CLK_D2 with a delay D provided by delay cell 230. Because clock CLK_D1 serves as the input for flip-flop 210, the logic level of clock CLK_D1 provides the logic level for signal S1 at time of triggering flip-flop 210. Similarly, because clock CLK_D1 serves as input for flip-flop 220, the logic level of clock CLK_D1 also provides the logic level for signal S2 at time of triggering flip-flop 220. Some embodiments, based on the logic levels of signals S1 and S2 and appropriate delay time D, determine whether the rising or falling edge of clock CLK_D2' should be used to trigger flip-flop 135 such that clock CLK_D2' have sufficient setup time Tsetup and hold time Thold.

Signal S2 inverted by inverter 240 provides signal SEL to control mux 125. When signal SEL is low (e.g., "0"), mux 125 selects clock CLK_D2 on line 140 to provide clock CLK_D2' on line 127. Mux 125, however, selects clock CLK_D2 inverted by inverter 115 on line 141 to provide clock CLK_D2' on line 127 when signal SEL is high (e.g., "1").

FIGS. 3-6 are graphs of waveforms 300-600 illustrating the relationship between clocks CLK_D1 and CLK_D2 and how some embodiments, based on the logic levels of signals S1 and S2, select an edge (e.g., a rising or a falling edge) of clock CLK_D2 for triggering when clock CLK_D1 triggers flip-flop 105 by its falling edge.

Figure 3:
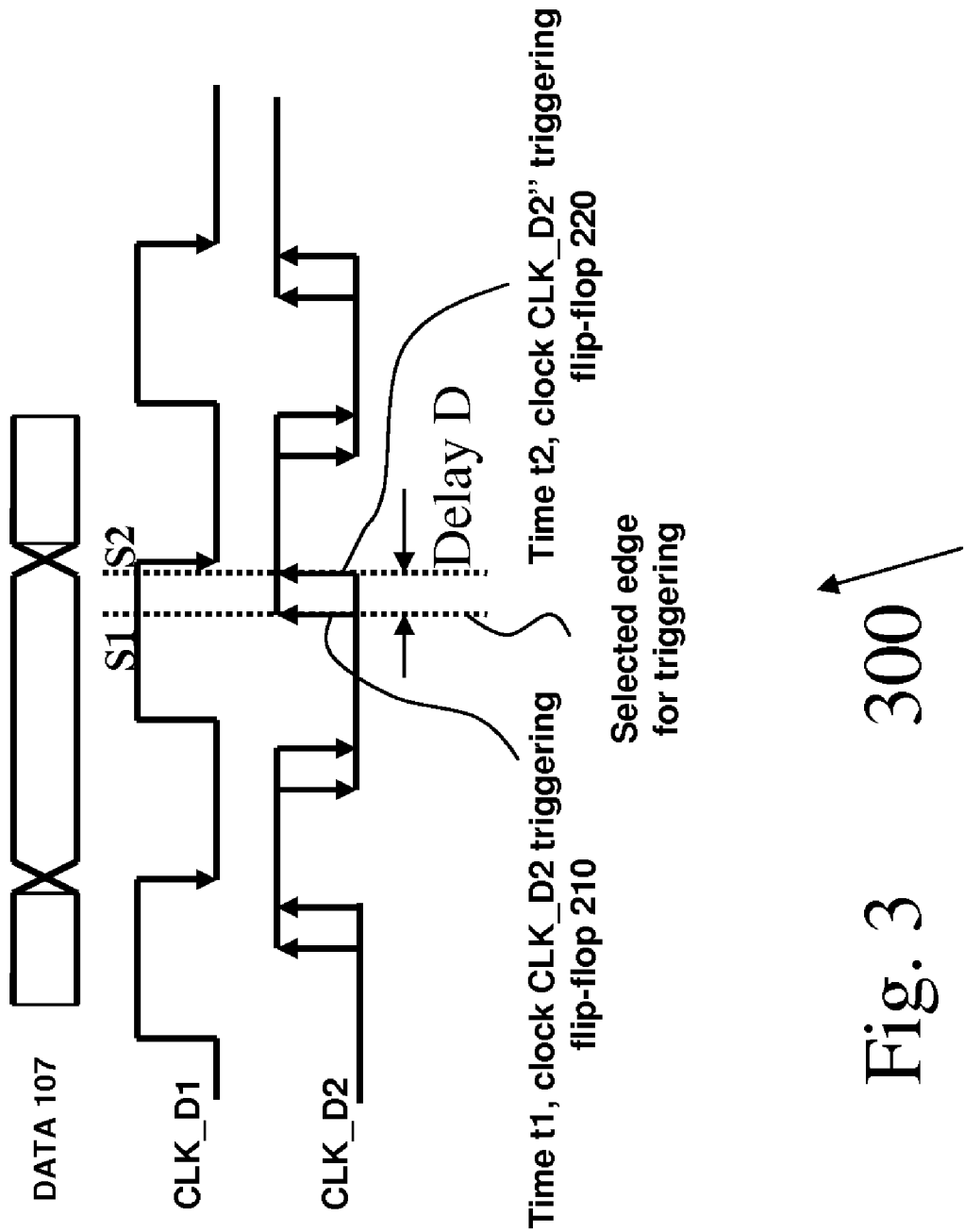
FIGS. 3-6 are graphs of waveforms illustrating how some embodiments, based on the logic levels of signals S1 and S2, select an edge of clock CLK_D2 for triggering when clock CLK_D1 uses its falling edge for triggering.

In FIG. 3, signal S1 (or clock CLK_D1) is high at time t1 when clock CLK_D2 triggers flip-flop 210, and signal S2 (also clock CLK_D1) is high at time t2 when clock CLK_D2" triggers flip-flop 220. As a result, embodiments use the rising edge of clock CLK_D2 (or clock CLK_D2') to trigger flip-flop 135 because this rising edge triggering provides sufficient setup time Tsetup and hold time Thold for clock CLK_D2'. Because embodiments select the rising edge of clock CLK_D2, clock CLK_D2 passes through mux 125 to form clock CLK_D2' on line 107 without passing through inverter 115.

Figure 4:
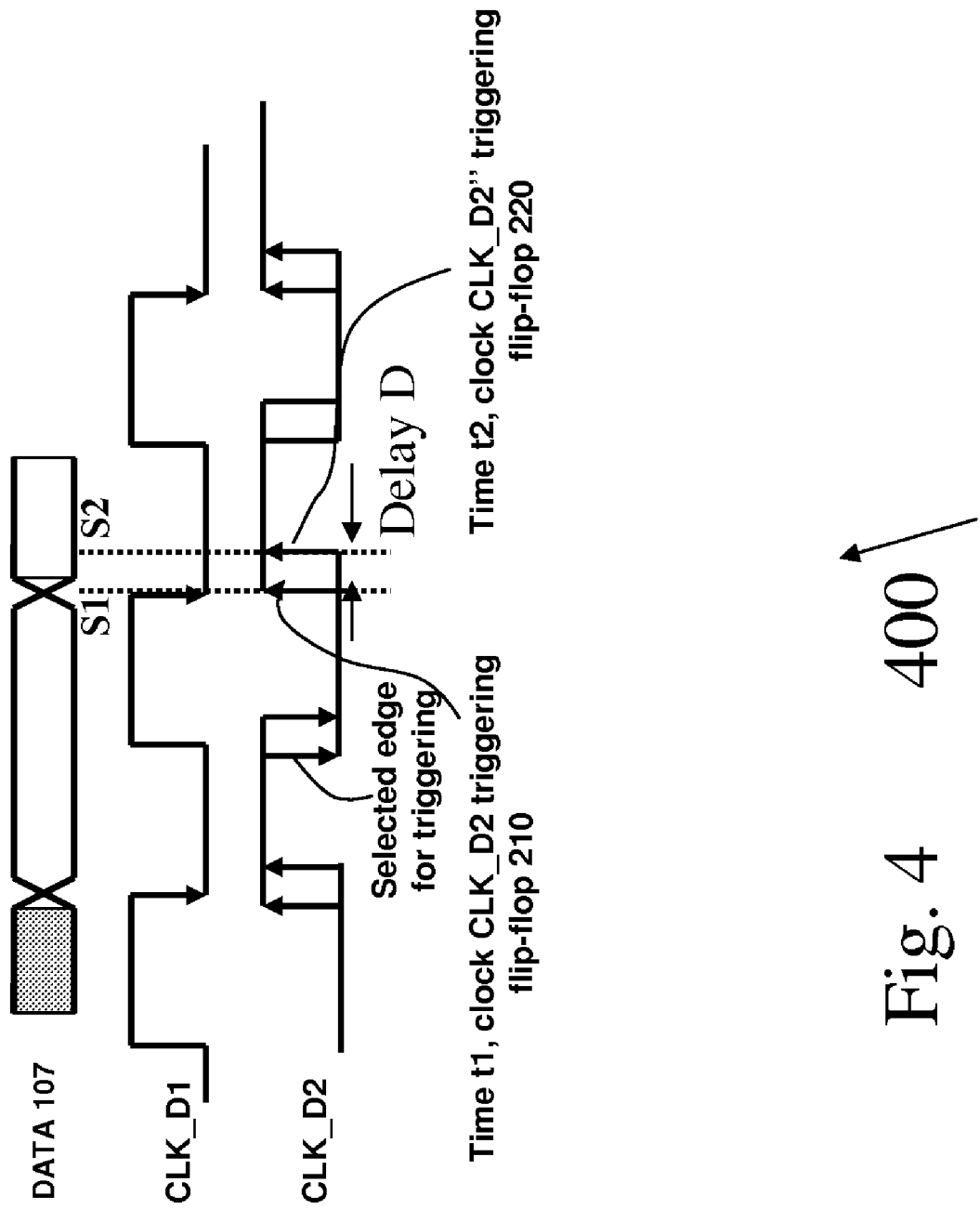

In FIG. 4, signal S1 is high at time t1 when clock CLK_D2 triggers flip-flop 210, and signal S2 is low at time t2 when clock CLK_D2" triggers flip-flop 220. As a result, embodiments use the falling edge of clock CLK_D2' to trigger flip-flop 135 because the rising edge would not provide sufficient hold time Thold for clock CLK_D2'. Because embodiments select the falling edge of clock CLK_D2, clock CLK_D2 passes through inverter 115 and mux 125 to form clock CLK_D2' on line 107.

Figure 5:
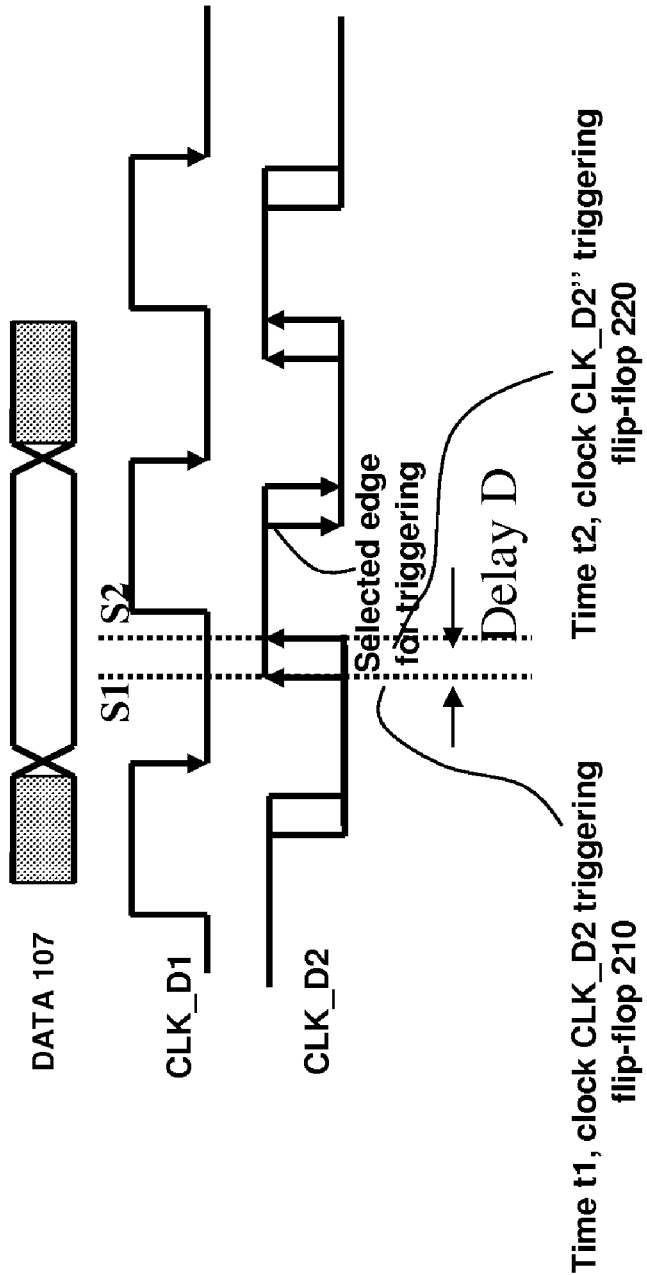

In FIG. 5, signal S1 is low at time t1 when clock CLK_D2 triggers flip-flop 210, and signal S2 is also low at time t2 when clock CLK_D2" triggers flip-flop 220. As a result, embodiments use the falling edge of clock CLK_D2' to trigger flip-flop 135 because the rising edge may not provide sufficient setup time Tsetup for clock CLK_D2'. Because embodiments select the falling edge of clock CLK_D2, clock CLK_D2 passes through inverter 115 and mux 125 to form clock CLK_D2' on line 107.

Figure 6:
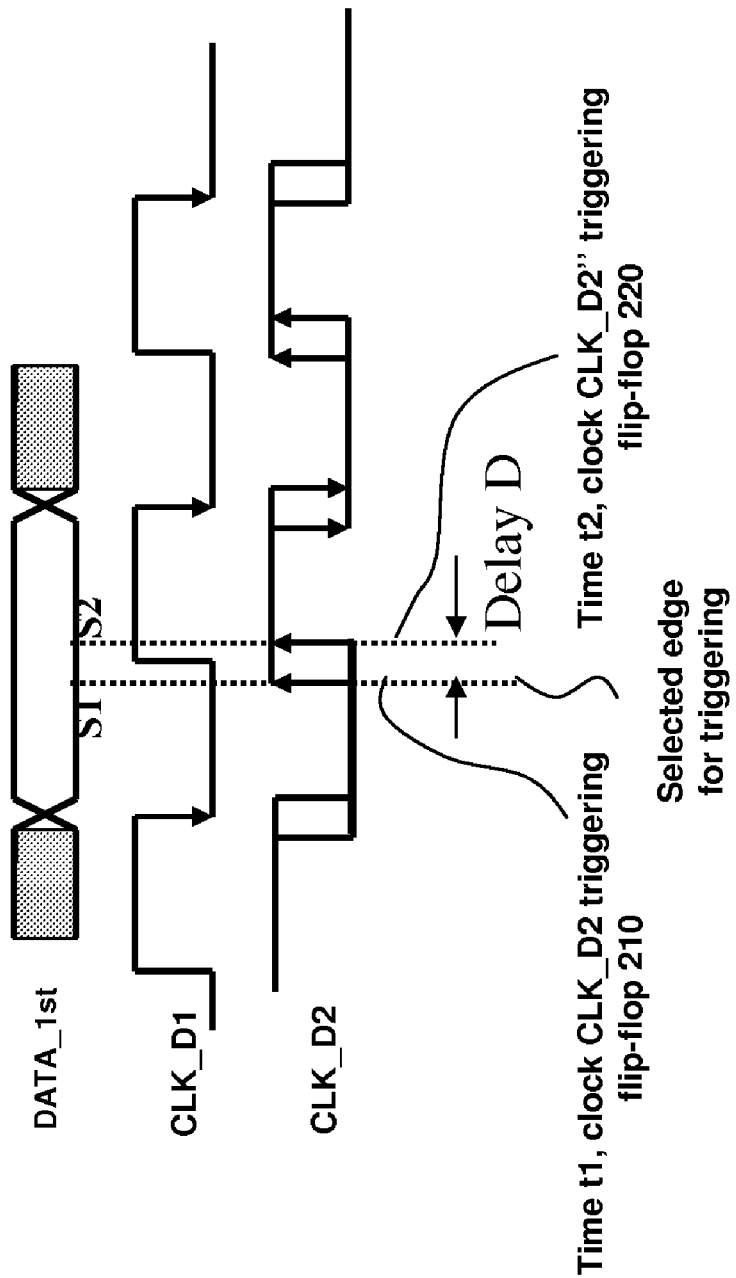

In FIG. 6, signal S1 is low at time t1 when clock CLK_D2 triggers flip-flop 210, and signal S2 is high at time t2 when clock CLK_D2" triggers flip-flop 220. As a result, embodiments use the rising edge of clock CLK_D2' to trigger flip-flop 135 because this rising edge provides sufficient setup time Tsetup and hold time Thold for clock CLK_D2'. Because embodiments select the rising edge of clock CLK_D2, clock CLK_D2 passes through mux 125 to form clock CLK_D2' on line 107 without passing through inverter 115.

Figure 7:
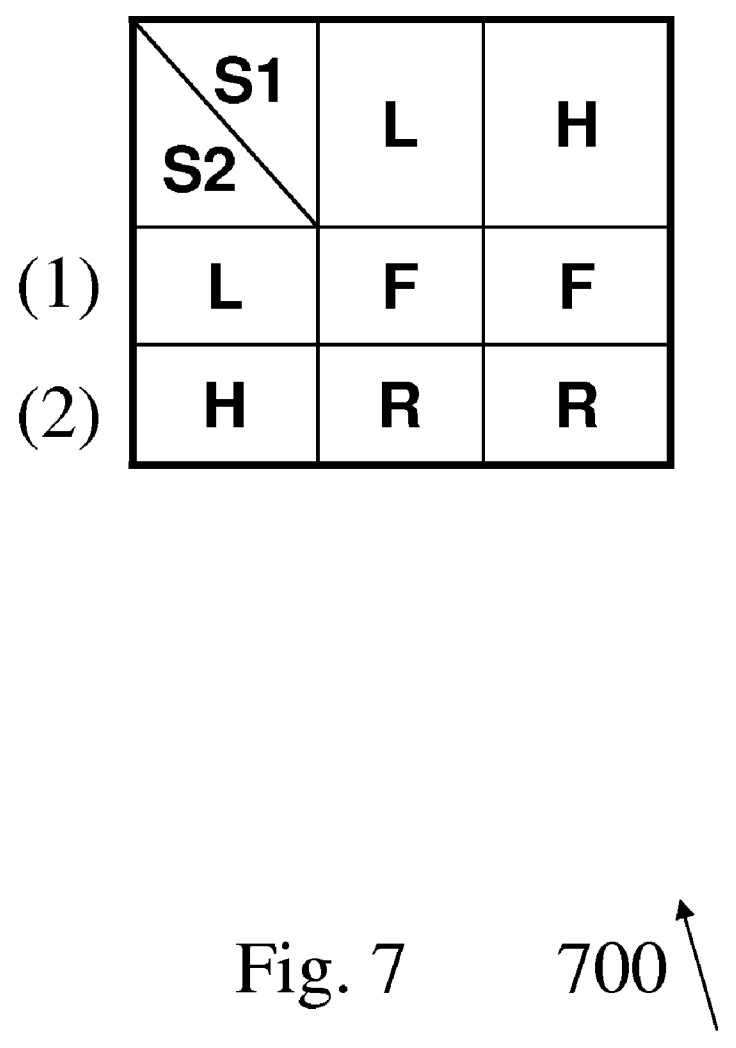

FIG. 7 is a table 700 summarizing the triggering edge for clock CLK_D2' (or clock CLK_D2) with respect to the logic level relationship between signals S1 and S2, when clock CLK_D1 uses its falling edge to trigger as illustrated in FIGS. 3-6, in accordance with some embodiments. An F and an R in table 700 indicate a falling and rising edge respectively. In table 700, when signals S1 and S2 are LL, LH, HL, and HH, the triggering edges are F, R, F, and R, consistent with the above illustrations in FIGS. 3-6. An "L" and an "H" refer to a low logic and a high logic respectively.

In FIG. 7 when signal S2 is L, the falling edge (F) of clock CLK_D2 is selected regardless of the logic level of signal S1 (row 1). At that time signal SEL is high ("1") and shown in mux 125 in FIG. 1. Similarly, when signal S2 is H, the rising edge (R) of clock CLK_D2 is selected regardless of the logic level of signal S1 (row 2). At that time signal SEL is low ("0") and shown in mux 125 in FIG. 1. As a result, signal SEL is the inverse of signal S2, consistent with FIG. 2 in which signal SEL is inverted by inverter 240 from signal S2.

Because, as shown in FIG. 7, when signal S2 is L, the falling edge of clock CLK_D2 (e.g., both F's in row 1) is selected regardless of the logic level of signal S1, and when signal S2 is high the rising edge of clock CLK_D2 (e.g., both R's in row 2) is selected, also regardless of the logic level of signal S1, signal S2 contributes to providing signal SEL or to selecting the trigger edge of clock CLK_D2 independent of signal S1.

FIG. 8 is a schematic diagram of an edge detection 800 illustrating edge detector 130 in accordance with a second embodiment in which clock CLK_D1 uses its falling edge to trigger flip-flop 105 and signal SEL is generated independent of signal S1. Compared with edge detector 200, edge detector 800 does not include flip-flop 210 or signal S1.

FIG. 9 is a schematic diagram of an edge detector 900 illustrating edge detector 130 in accordance with a third embodiment in which clock CLK_D1 uses its rising edge to trigger flip-flop 105. Compared with edge detector 200, edge detector 900 includes similar elements, but edge detector 900 does not include inverter 240, and signal SEL is the same as signal S2, instead of being inverted by inverter 240 as in FIG. 2.

FIGS. 10-13 are graphs of waveforms 1000-1300 illustrating the relationship between clocks CLK_D1 and CLK_D2 and how some embodiments, based on the logic level relationship between signals S1 and S2, select an edge of clock CLK_D2 for triggering when clock CLK_D1 triggers flip-flop 105 by its rising edge.

Figure 10:
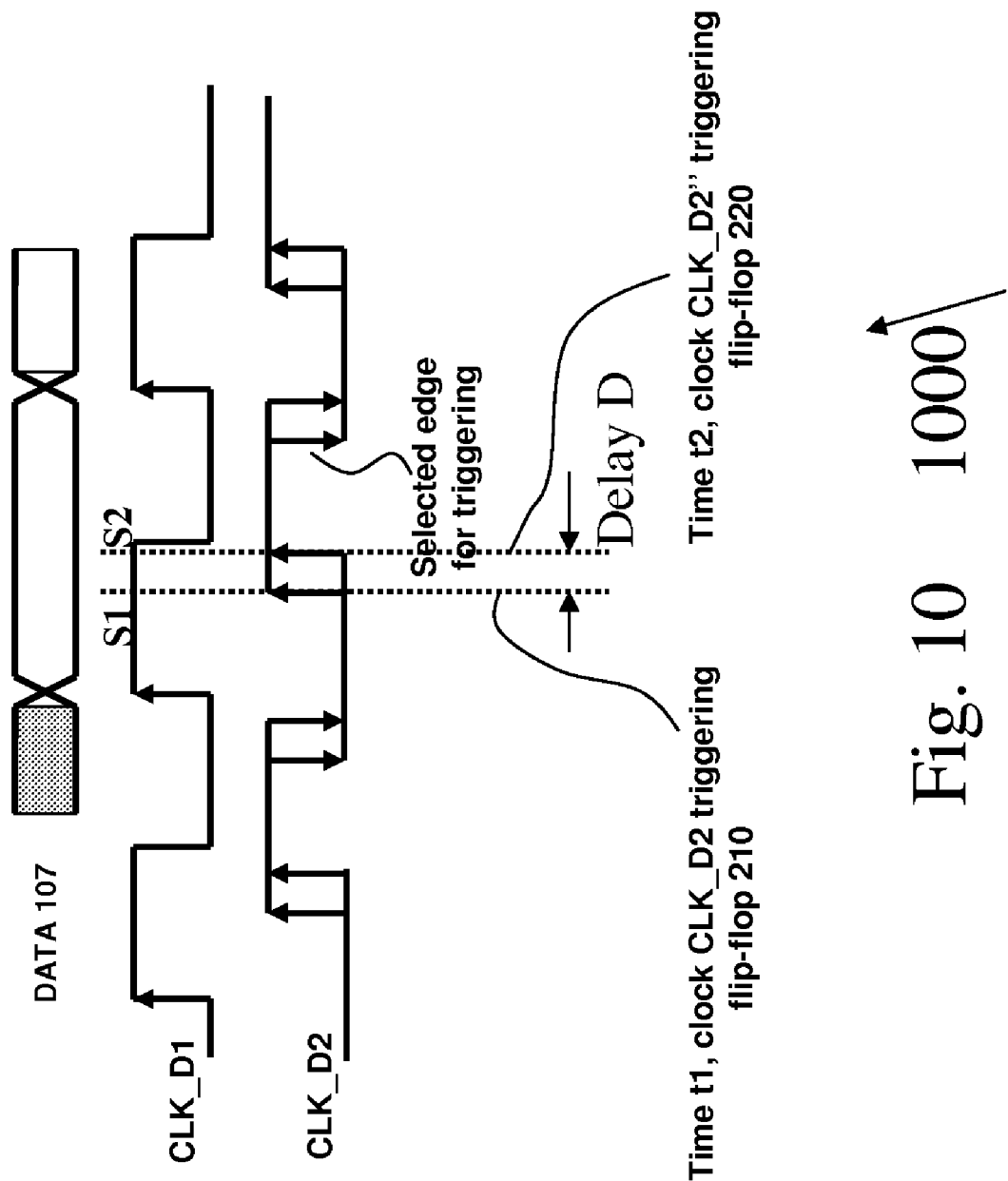
FIGS. 10-13 are graphs of waveforms illustrating how some embodiments, based on the logic levels of signals S1 and S2, select an edge of clock CLK_D2 for triggering when clock CLK_D1 uses its rising edge for triggering.

In FIG. 10, signal S1 is high at time t1 when clock CLK_D2 triggers flip-flop 210, and signal S2 is also high at time t2 when clock CLK_D2" triggers flip-flop 220. As a result, embodiments use the falling edge of clock CLK_D2' to trigger flip-flop 135 because the rising edge trigger may not provide sufficient setup time Tsetup for clock CLK_D2'. Because embodiments select the falling edge of clock CLK_D2, clock CLK_D2 passes through inverter 115 and mux 125 to form clock CLK_D2' on line 107.

Figure 11:
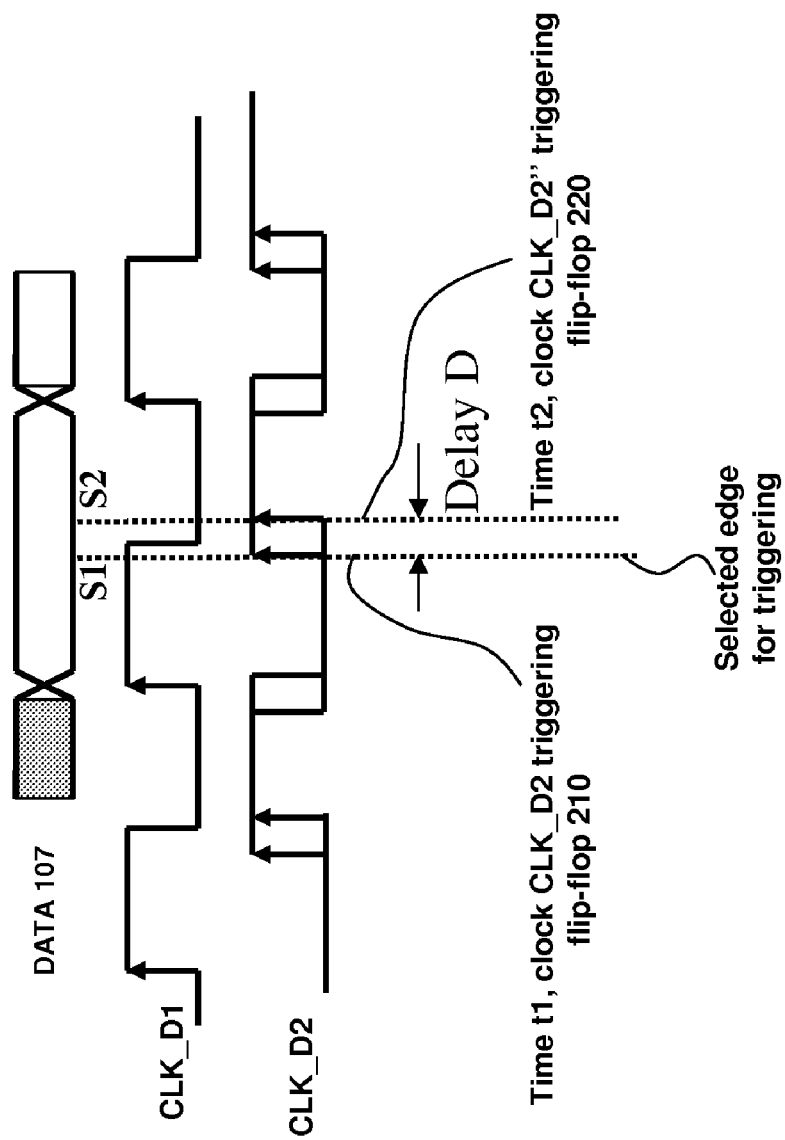

In FIG. 11, signal S1 is high at time t1 when clock CLK_D2 triggers flip-flop 210, and signal S2 is low at time t2 when clock CLK_D2" triggers flip-flop 220. As a result, embodiments use the rising edge of clock CLK_D2' to trigger flip-flop 135 because the rising edge provides sufficient setup time Tsetup and hold time Thold for clock CLK_D2'. Because embodiments select the rising edge of clock CLK_D2, clock CLK_D2 passes through mux 125 to form clock CLK_D2' on line 107 without passing through inverter 115.

Figure 12:
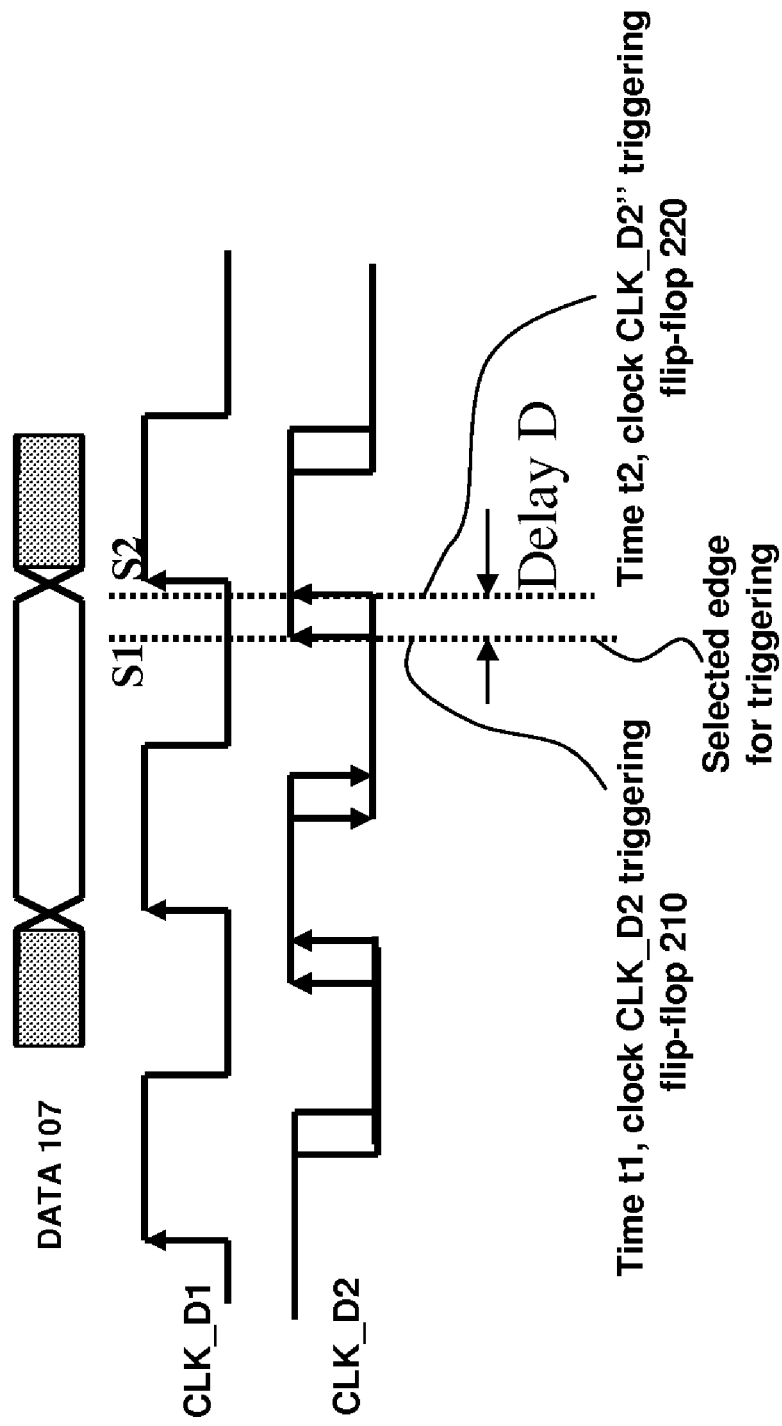

In FIG. 12, signal S1 is low at time t1 when clock CLK_D2 triggers flip-flop 210, and signal S2 is also low at time t2 when clock CLK_D2" triggers flip-flop 220. As a result, embodiments use the rising edge of clock CLK_D2' to trigger flip-flop 135 because this rising edge provides sufficient hold time Thold for clock CLK_D2'. Because embodiments select the rising edge of clock CLK_D2, clock CLK_D2 passes through mux 125 to form clock CLK_D2' on line 107 without passing through inverter 115.

Figure 13:
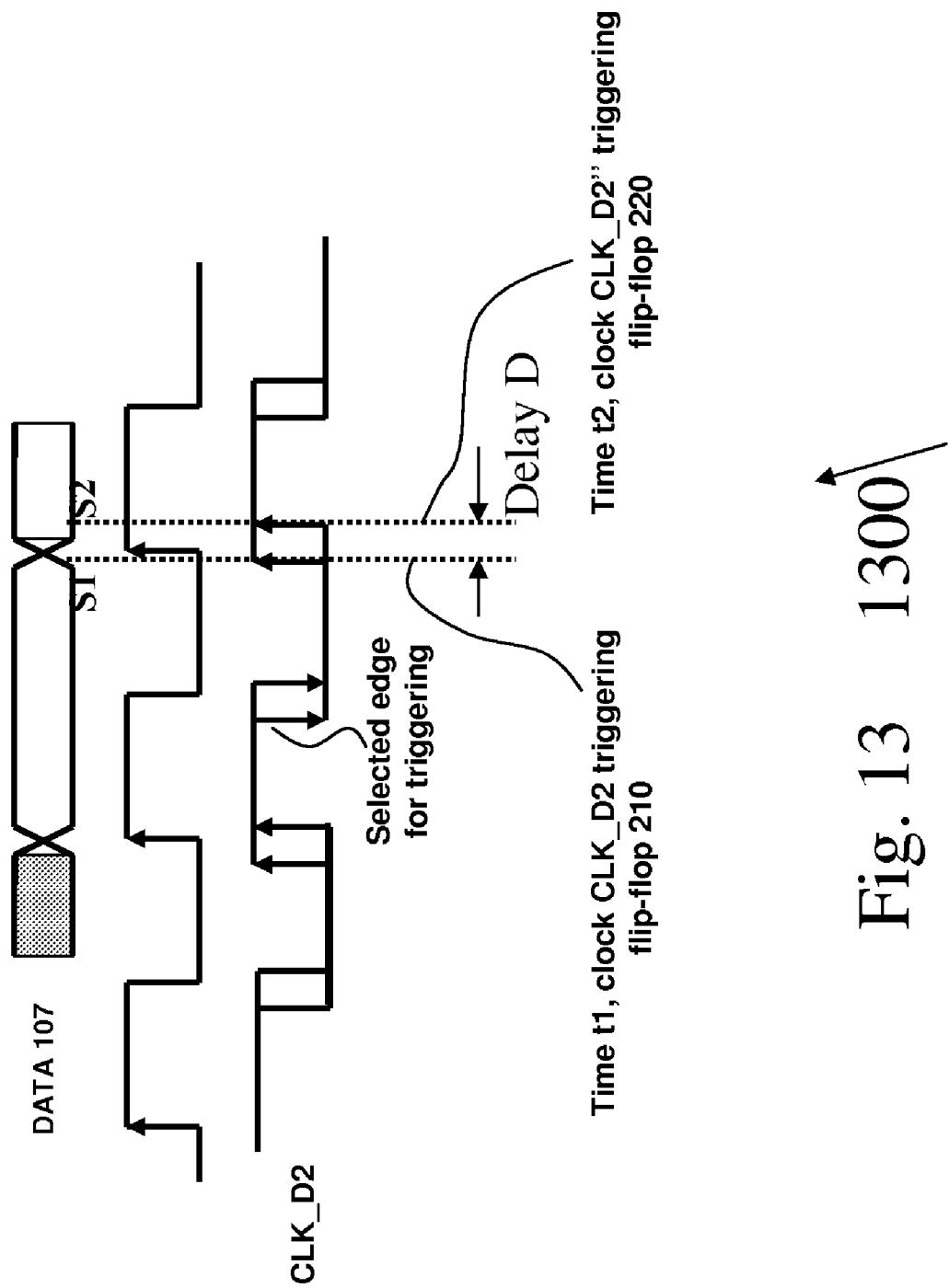

In FIG. 13, signal S1 is low at time t1 when clock CLK_D2 triggers flip-flop 210, and signal S2 is high at time t2 when clock CLK_D2" triggers flip-flop 220. As a result, embodiments use the falling edge of clock CLK_D2' to trigger flip-flop 135 because the rising edge would not provide sufficient hold time Thold for clock CLK_D2'. Because embodiments select the falling edge of clock CLK_D2, clock CLK_D2 passes through inverter 115 and mux 125 to form clock CLK_D2' on line 107.

Figure 14:
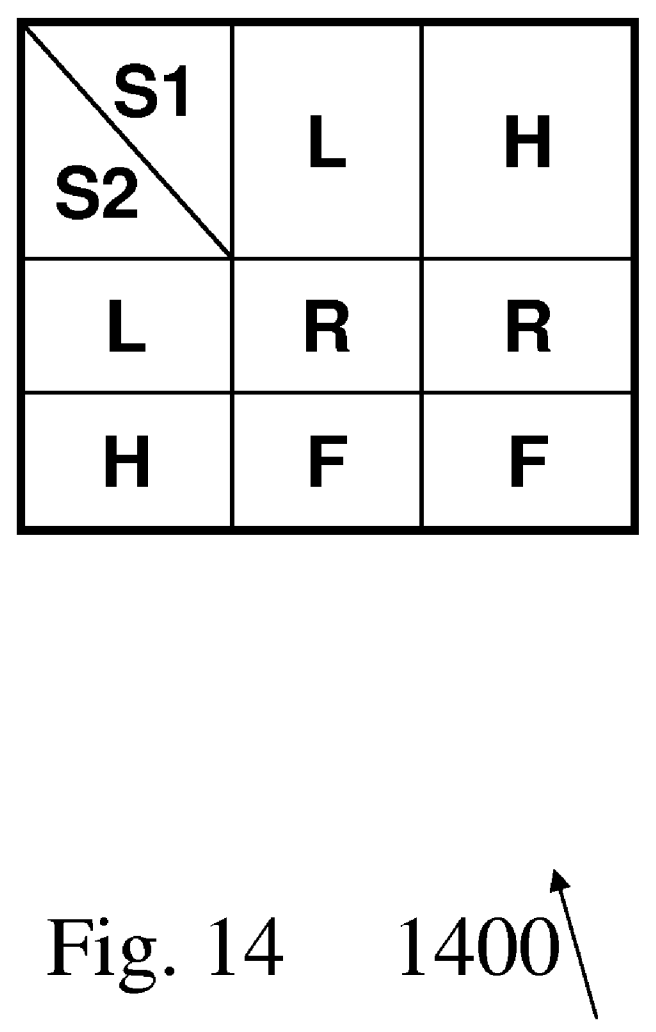

FIG. 14 is a table 1400 summarizing the triggering edge for clock CLK_D2' (or clock CLK_D2) with respect to the logic level relationship between signals S1 and S2 when clock CLK_D1 uses its rising edge to trigger as illustrated in FIGS. 10-13. An F and an R in table 1400 indicate a falling and rising edge respectively. In table 1400, when signals S1 and S2 are LL, LH, HL, and HH, the triggering edges are R, F, R, and F, consistent with the above illustration in FIGS. 10-13.

In FIG. 14 when signal S2 is L, the rising edge (R) of clock CLK_D2 is selected regardless of the logic level of signal S1 (row 1). At that time signal SEL is low ("0") and shown in mux 125 in FIG. 1. Similarly, when signal S2 is H, the falling edge (F) of clock CLK_D2 is selected regardless of the logic level of signal S1 (row 2). At that time signal SEL is high ("1") and shown in mux 125 in FIG. 1. As a result, signal SEL is at the same logic level as signal S2, consistent with FIG. 9 in which signal SEL is the same as signal S2.

Because, as shown in FIG. 14, when signal S2 is L, the rising edge of clock CLK_D2 (e.g., both R's in row 1) is selected regardless of the logic level of signal S1 and when signal S2 is high the falling edge of clock CLK_D2 (e.g., both L's in row 2) is selected, also regardless of the logic level of signal S1, signal S2 contributes to providing signal SEL or to selecting the trigger edge of clock CLK_D2 independent of signal S1.

Figure 15:
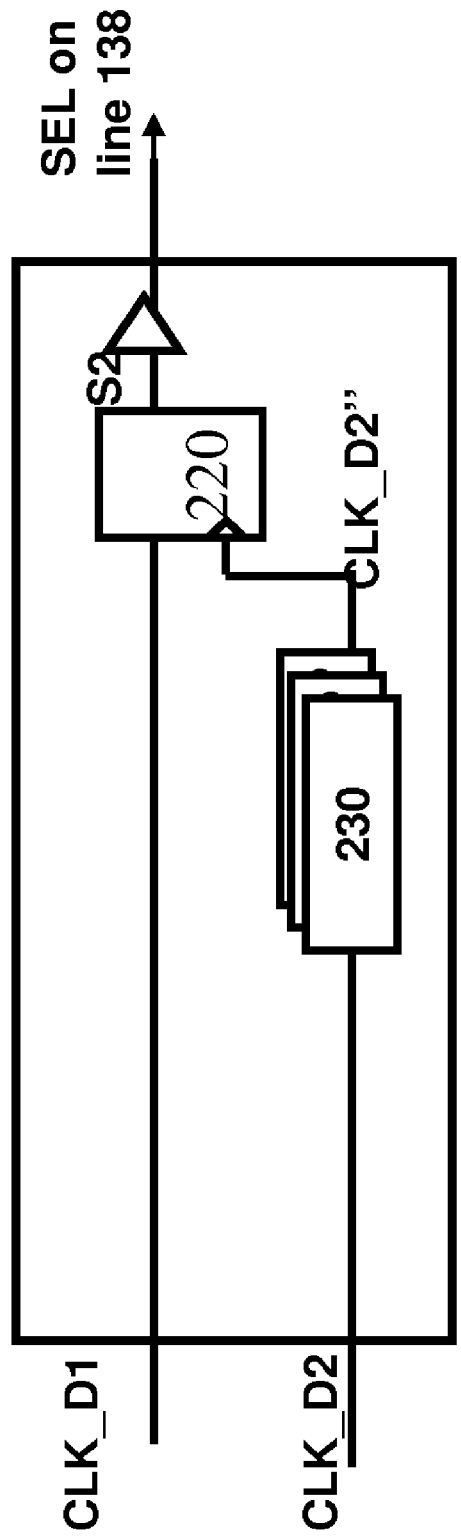
FIG. 15 is a schematic diagram of the edge detector 130 in accordance with a fourth embodiment in which clock CLK_D1 uses its rising edge for triggering and the select signal SEL is independent of signal S1.

FIG. 15 is a schematic diagram of an edge detector 1500 illustrating edge detector 130 in accordance with a fourth embodiment in which signal SEL is generated independent of signal S1. Compared with edge detector 900, edge detector 1500 does not include signal S1 and corresponding flip-flop 210. Edge detector 1500 functions similarly to edge detector 900.

Edge Detector Circuit Embodiment Using RC Circuits

Figure 16:
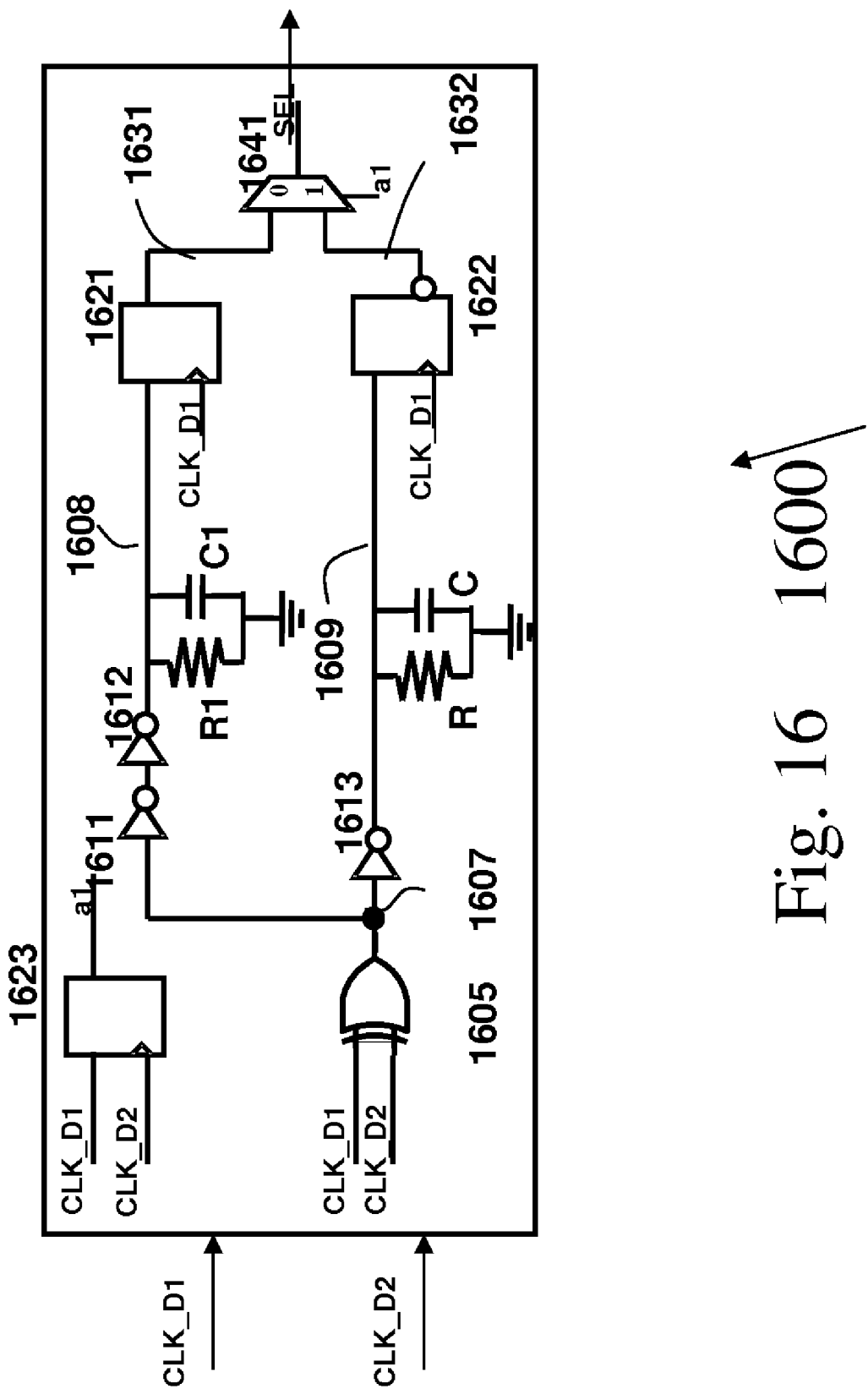
FIG. 16 is a schematic diagram of the edge detector 130 in accordance with a fifth embodiment in which an RC circuit is used.

FIG. 16 is a schematic diagram of an edge detector 1600 illustrating edge detector 130 in accordance with a fifth embodiment in which the edge selected for clock CLK_D2 to trigger is based on an resistor/capacitor circuit.

Logical exclusive OR circuit (X-OR) 1605 receives clocks CLK_D1 and CLK_D2 as inputs. When clocks CLK_D1 and CLK_D2 are both high, X-OR 1605 generates a low logic level on line 1607 and inverter 1613 generates a high logic level on line 1609. In effect, some embodiments, based on clock CLK_D1 and CLK_D2, generate a positive pulse having a width W (e.g., widths W1, W2, W7, W8) on line 1609, which charges the RC circuit. Further, embodiments based on the size of the corresponding width to select the rising or falling edge of clock CLK_D2 (or clock CLK_D2') to trigger data for flip-flop 135. In various embodiments, width W is compared with a predetermined value, e.g., width Wref (not shown) that includes one or a combination of hold time Thold 105 for flip-flop 105 and a predetermined value Tjitter to compensate for jittering in clock CLK_D2.

When clocks CLK_D1 and CLK_D2 have different logic levels (e.g., one is low, the other one is high), X-OR 1605 provides a high logic level on line 1607, and inverters 1611 and 1612 generate the same high logic level on line 1608. In effect, embodiments generate a positive pulse having a width W (e.g., width W3, W4, W5, W6) on line 1608, which charges the $R_1 C_1$ circuit. Further, embodiments based on the size of width W to select the rising or falling edge of clock CLK_D2' to trigger data for flip-flop 135. In various embodiments, width W is compared with a predetermined value, e.g., width Wref that includes one or a combination of the hold time Thold 105 for flip-flop 105 and a predetermined value Tjitter to compensate for jittering in clock CLK_D2.

Clock CLK_D1 triggers data on line 1608 through flip-flop 1621 to provide data on line 1631. Clock CLK_D1 also triggers data on line 1609 through flip-flop 1622 to provide data on line 1632. Signal a1 selects either signal on line 1631 or on line 1632 to provide the select signal SEL on line 138.

In some embodiments, when signal a1 is low, mux 1641 selects data on line 1631, but when signal a1 is high, mux 1641 selects data on line 1632.

Clock CLK_D2 triggers clock CLK_D1 through flip-flop 1623 to provide select signal a1. When width W is large enough as compared with width Wref, the data on line 1632 (the negative output of flip-flop 1622) is low and the rising edge of clock CLK_D2 is selected, signal a1 is configured to provide a high signal for mux 1641 to select line 1632 as select signal SEL, which allows clock CLK_D2 to pass through mux 125 without going through inverter 115 to form clock CLK_D2'. When width W is not large enough, however, the data on line 1632 is high, signal a1 is configured to provide a low signal for mux 1641 to select line 1631 as select signal SEL, which allows clock CLK_D2 to pass through inverter 115 and mux 125 to form clock CLK_D2'.

Figure 17:
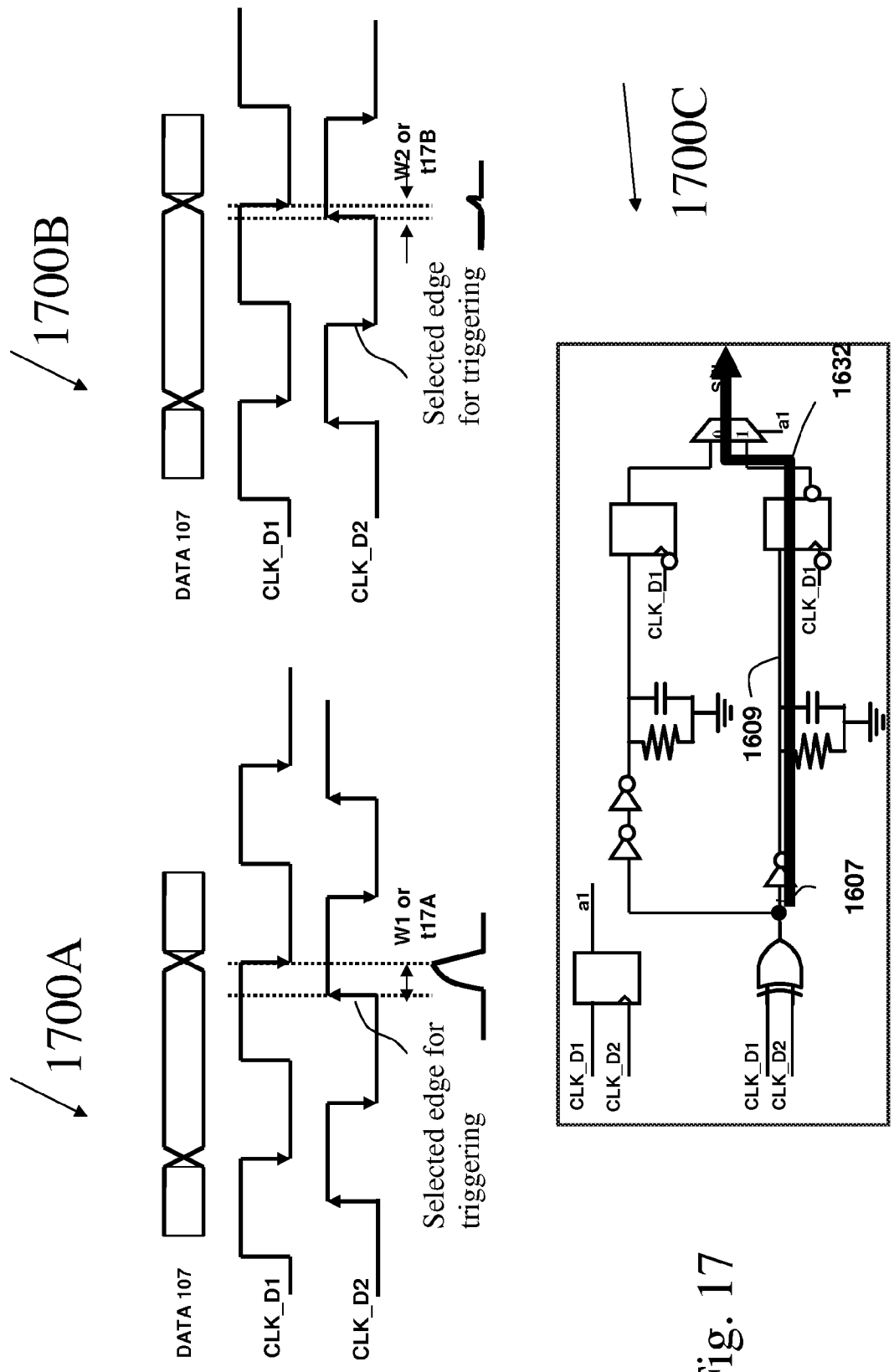
FIGS. 17-20 are graphs of waveforms illustrating how some embodiments, based on the signal width generated by the RC circuit in FIG. 16, select an edge of clock CLK_D2 for triggering.

FIG. 17 shows waveforms 1700A and 1700B illustrating how some embodiments select the rising or falling edge of clock CLK_D2 when clock CLK_D1 uses its falling edge to trigger data. In both situations illustrated by waveforms 1700A and 1700B, the rising edge of clock CLK_D2 is before the falling edge of clock CLK_D1 and during time periods tl7A and t17B both clocks CLK_D1 and CLK_D2 are high, which triggers the RC circuit.

In waveforms 1700A width W1 starts at the rising edge of clock CLK_D2 and is large enough compared with width Wref to correspond to a sufficient hold time Thold for clock CLK_D2'. As a result, embodiments select the rising edge of clock CLK_D2 (or clock CLK_D2') as the triggering edge. In this illustration, the RC circuit has enough time to charge line 1609 to a high logic level, providing a large enough width W1.

In waveforms 1700B, width W2, in contrast, is not large enough to correspond to a sufficient hold time Thold for clock CLK_D2'. As a result, embodiments select the falling edge of clock CLK_D2 as the triggering edge. In this illustration, the RC circuit does not have enough time to charge line 1609 to a high logic level, consequently provides a small width W2.

In both situations illustrated by waveforms 1700A and 1700B because both clocks CLK_D1 and CLK_D2 are high, the selected signal SEL is generated from X-OR 1605 through lines 1607, 1609, and 1632, which is shown in FIG. 1700C.

Figure 18:
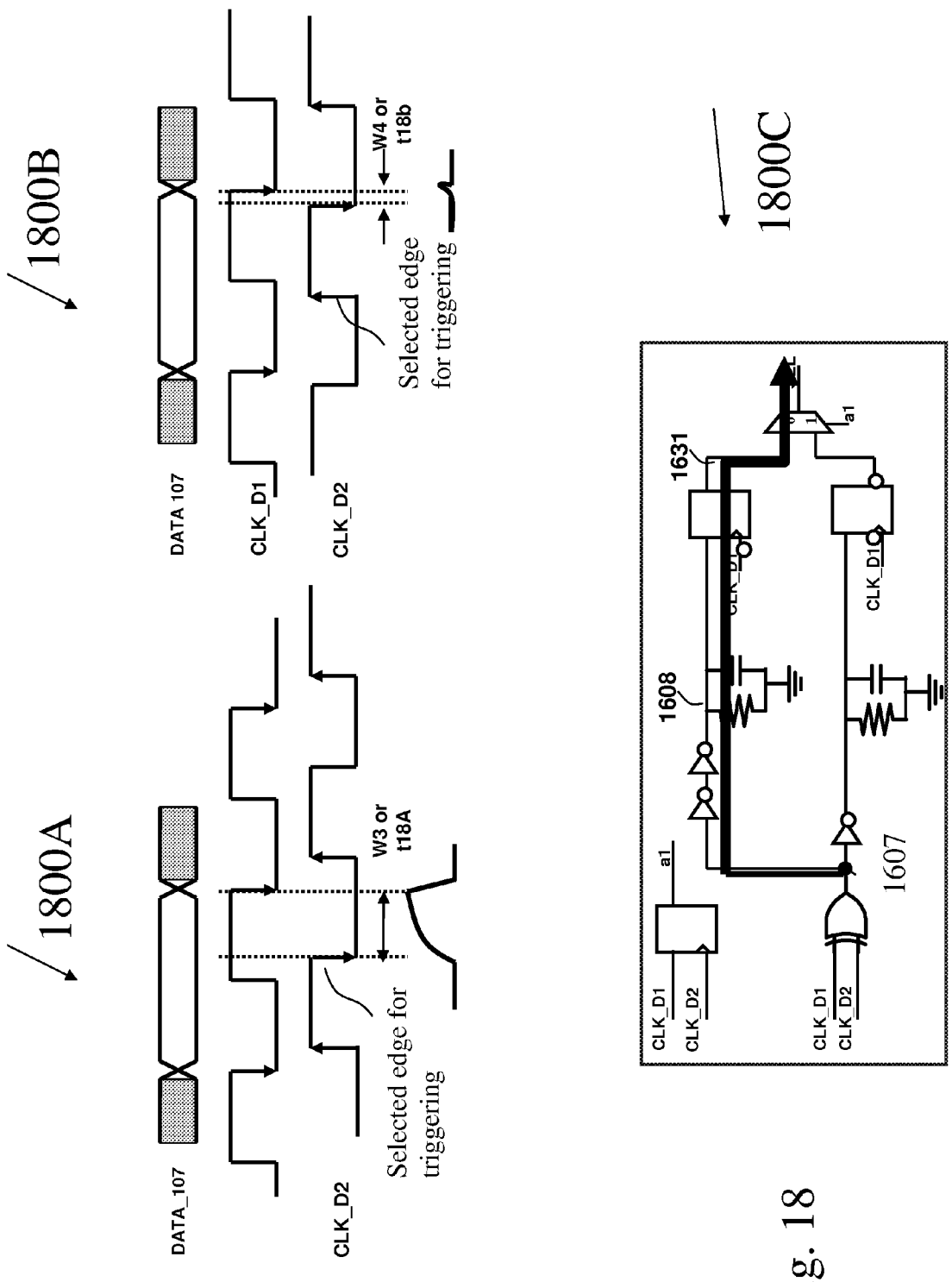

FIG. 18 shows waveforms 1800A and 1800B illustrating how some embodiments select the rising or falling edge of clock CLK_D2 when clock CLK_D1 uses its falling edge to trigger data. In both situations illustrated by waveforms 1800A and 1800B, the falling edge of clock CLK_D2 is before the falling edge of clock CLK_D1 and during time periods tl8A and tl8B clock CLK_D1 is high and clock CLK_D2 is low, which triggers the $R_1C_1$ circuit.

In waveforms 1800A, width W3 starts at the falling edge of clock CLK_D2 and is large enough to correspond to a sufficient hold time Thold for clock CLK_D2'. As a result, embodiments select the falling edge of clock CLK_D2' as the triggering edge. In this illustration, the $R_1C_1$ circuit has enough time to charge line 1608 to a high logic level, providing a large enough width W3.

In waveforms 1800B, width W4, in contrast, is not large enough to correspond to a sufficient hold time Thold for clock CLK_D2'. As a result, embodiments select the rising edge of clock CLK_D2 as the triggering edge. In this illustration, the $R_1C_1$ circuit does not have enough time to charge line 1608 to a high logic level, and consequently provides a small width W4.

In both situations illustrated by waveforms 1800A and 1800B because clocks CLK_D1 and CLK_D2 have different logic levels, the selected signal SEL is generated from X-OR 1605 through lines 1607, 1608, and 1631, which is shown in FIG. 1800C.

Figure 19:
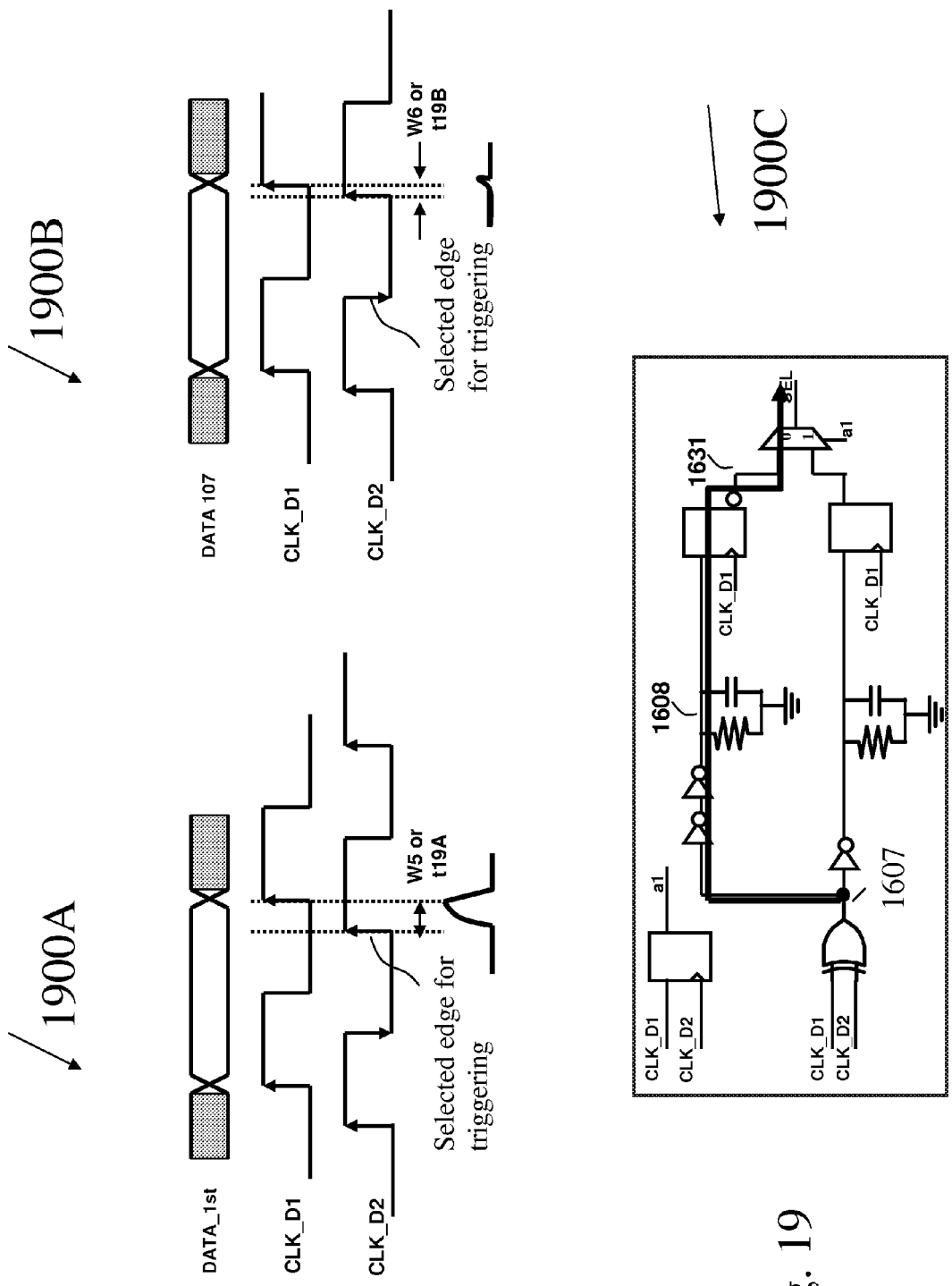

FIG. 19 shows waveforms 1900A and 1900B illustrating how some embodiments select the rising or falling edge of clock CLK_D2 when clock CLK_D1 uses its rising edge to trigger data. In both situations, the rising edge of clock CLK_D2 is before the rising edge of clock CLK_D1 and during time periods t19A and t19B clock CLK_D1 is low and CLK_D2 is high, which triggers the $R_1C_1$ circuit.

In waveforms 1900A width W5 starts at the rising edge of clock CLK_D2, and is large enough to correspond to a sufficient hold time Thold for clock CLK_D2'. As a result, embodiments select the rising edge of clock CLK_D2 (or clock CLK_D2') as the triggering edge. In this illustration, the $R_1C_1$ circuit has enough time to charge line 1608 to a high logic level, providing a large enough width W5.

In waveforms 1900B, width W6, in contrast, is not large enough to correspond to a sufficient hold time Thold for clock CLK_D2'. As a result, embodiments select the falling edge of clock CLK_D2 as the triggering edge. In this illustration the $R_1C_1$ circuit does not have enough time to charge line 1608 to a high logic level, and consequently provides a small width W6.

In both situations illustrated by waveforms 1900A and 1900B because clocks CLK_D1 and CLK_D2 have different logic levels, the selected signal SEL is generated from X-OR 1605 through lines 1607, 1608, and 1631, which is shown in FIG. 1900C.

Figure 20:
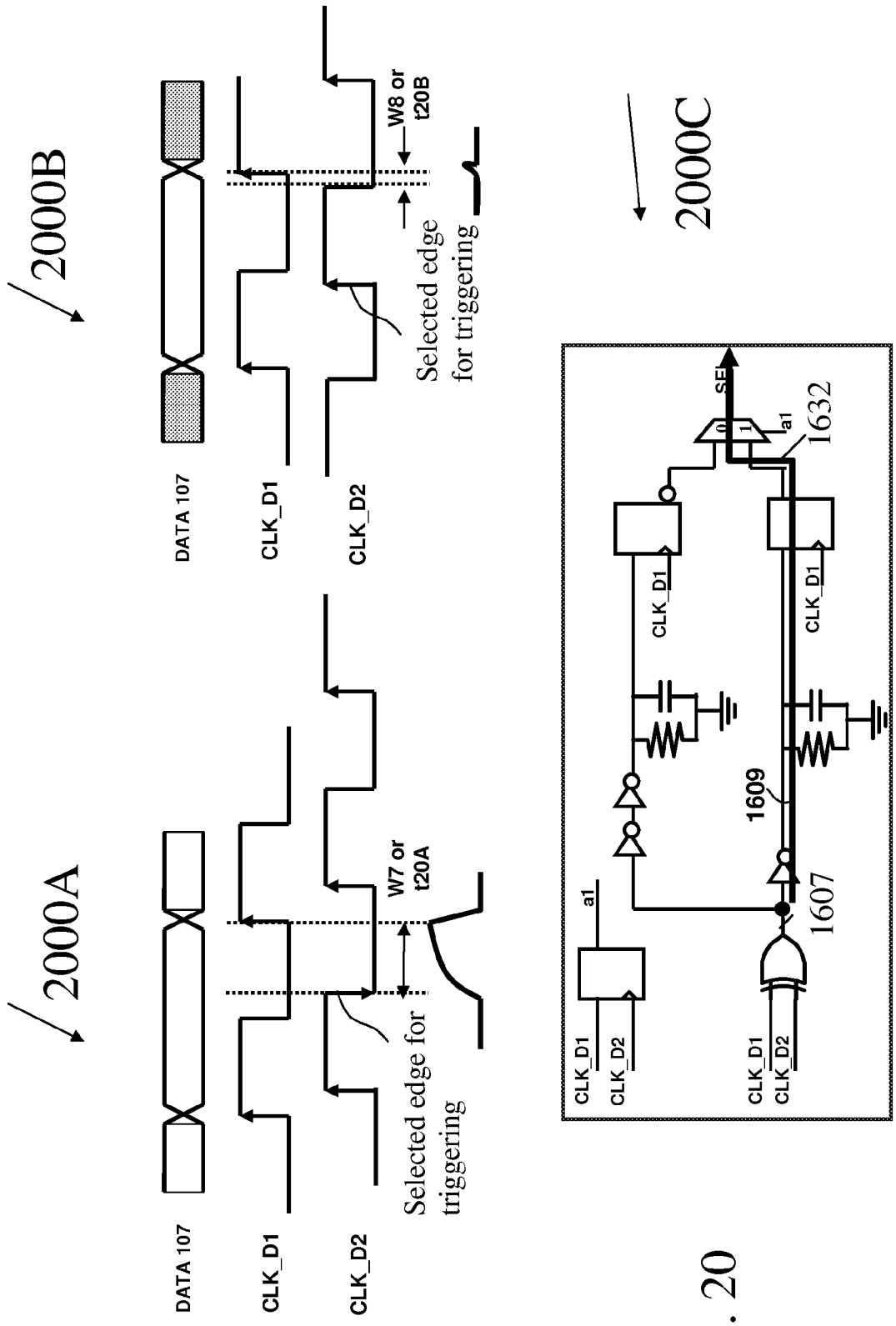

FIG. 20 shows waveforms 2000A and 2000B illustrating how some embodiments select the rising or falling edge of clock CLK_D2 when clock CLK_D1 uses its rising edge to trigger data. In both situations, the falling edge of clock CLK_D2 is before the rising edge of clock CLK_D1 and during times t20A and t20B both clocks CLK_D1 CLK_D2 are low, which triggers the RC circuit.

In waveforms 2000A width W7 starts at the falling edge of clock CLK_D2 and is large enough to correspond to a sufficient hold time Thold for clock CLK_D2'. As a result, embodiments select the falling edge of clock CLK_D2' as the triggering edge. In this illustration, the RC circuit has enough time to charge line 1609 to a high logic level, providing a large enough width W7.

In waveforms 2000B, width W8, in contrast, is not large enough to correspond to a sufficient hold time Thold for clock CLK_D2'. As a result, embodiments select the rising edge of clock CLK_D2 as the triggering edge. In this illustration, the RC circuit does not have enough time to charge line 1609 to a high logic level, and consequently provides a small width W8.

In both situations illustrated by waveforms 2000A and 2000B because clocks CLK_D1 and CLK_D2 have the same logic levels, the selected signal SEL is generated from X-OR 1605 through lines 1607, 1609, and 1632, which is shown in FIG. 2000C.

RC Calculations

Various embodiments of the disclosure select the value of resistors (e.g., resistor R, $R_1$) and capacitors (e.g., capacitor C, $C_1$) to provide the reference width Wref for comparing with the width W charged by the RC or $R_1C_1$ circuit on lines 1608 and 1609 respectively, as illustrated above with reference to FIGS. 17-20. For illustration, the RC circuit is used in the following explanation, but the $R_1C_1$ circuit and corresponding circuitry are equally applicable.

Let time period t1 be the charge time to generate the pulse width Wref; V(t) represent the voltage of the pulse having the width Wref; voltage V0 be Vdd, which is the operating voltage for the various devices in edge detector 1600; and τ be the RC constant (e.g., τ=RC).

$$\frac{V(t)}{V0} = (1 - e^{\frac{-t}{\tau}})$$

t1 is calculated based on the equation or $$\frac{V(t1)}{V0} = (1 - e^{\frac{-t1}{\tau}})$$

So that the output of D flip-flop 1622 is at a high logic level when desire, V(t1) in various embodiments is configured to be ½ V0 (or ½ Vdd). As a result, $$1/2 = (1 - e^{\frac{-t1}{\tau}})$$

or $$e^{\frac{-t1}{\tau}} = 1 - 0.5 = 0.5$$

or $$\ln(e^{\frac{-t1}{\tau}}) = \ln(0.5)$$

or $$-t1/\tau = -0.693$$

or $$t1 = 0.693\tau$$

or $$t1 = 0.693RC$$

Based on the above equation, the charge time t1 is determined based on a combination of the value of the resistor R and capacitor C. For example, if R=6K, C=70 pF then t1=0.693×6K×70 pF=291pS.

A number of embodiments of the invention have been described. It will nevertheless be understood that various modifications may be made without departing from the spirit and scope of the invention. For example, the various figures show the resistor/capacitor circuits (e.g., the RC, $R_1C_1$ circuits) using discrete resistors and capacitors for illustration only, equivalent circuitry may be used. For example, a resistive device, circuitry or network (e.g., a combination of resistors, resistive devices, circuitry, etc.) can be used in place of the resistor. Similarly, a capacitive device, circuitry or network (e.g., a combination of capacitors, capacitive devices, circuitry, etc.) can be used in place of the capacitor.

Each claim of this document constitutes a separate embodiment, and embodiments that combine different claims and/or different embodiments are within scope of the invention and will be apparent to those of ordinary skill in the art after reviewing this disclosure. Accordingly, the scope of the invention should be determined with reference to the following claims, along with the full scope of equivalences to which such claims are entitled.

What is claimed is:

1. A circuit comprising first device configured to receive a first clock; a second device configured to receive a third clock delayed from a second clock; and an edge detector comprising: a third device configured to receive the first clock as a data input; a delay element configured to receive the second clock and generate a fourth clock used as a clock input for the third device, and a delay time of the delay element is greater than a hold time of the first device; and a third device output providing a signal configured to select a falling edge of the second clock based on a first logic level of the first third device output and to select a rising edge of the second clock based on a second logic level of the third device output; the first logic level differing from the second logic level.

2. The circuit of claim 1 wherein the fourth clock is delayed from the second clock by the delay time relative to the hold time of the first device triggered by the first clock.

3. The circuit of claim 2 wherein the fourth clock is further delayed based on jittering of the second clock.

4. The circuit of claim 1 wherein selecting the falling edge or the rising edge of the second clock is further based on a trigger edge of the first clock.

5. The circuit detector of claim 4 wherein if the first clock uses its falling edge for triggering then the first logic level is low and the second logic level is high and if the first clock uses its rising edge for triggering then the first logic level is high and the second logic level is low.

6. The circuit of claim 1 wherein the second device is configured to receive the first clock as a data input and to receive the third clock as a clock input.

7. A circuit comprising: a first device configured to receive a first clock; a second device configured to receive a third clock delayed from a second clock; and an edge detector comprising: a third device configured to receive the first clock as a first data input and the second clock as a first clock input, and provide a third device output; a delay element configured to receive the second clock as an input and provide a fourth clock delayed from the second clock, and a delay time of the delay element is greater than a hold time of the first device; a fourth device configured to receive the first clock as a second data input and the fourth clock as a second clock input, and provide a fourth device output; an edge detector output providing an edge detector output signal based on a logic level of the third device output and of the fourth device output, wherein the edge detector output signal is used to select a falling edge of the second clock if the fourth device output is at a first logic level and to select a rising edge of the second clock if the fourth device output is at a second logic level.

8. The circuit of claim 7 wherein selecting the falling edge or the rising edge of the second clock is further based on a trigger edge of the first clock.

9. The circuit of claim 8 wherein if the first clock uses its falling edge for triggering then the first logic level is low and the second logic level is high and if the first clock uses its rising edge for triggering then the first logic level is high and the second logic level is low.

10. The circuit claim 7 wherein the fourth clock is delayed from the second clock by the delay time relative to the hold time of the first device triggered by the first clock.

11. The circuit of claim 10 wherein the fourth clock is further delayed from the second clock by the delay tame considering jittering of the second clock.

12. The circuit of claim 7 wherein the edge detector output signal is independent of the third device output.

13. A circuit comprising:
a first device configured to receive a first clock;
a second device configured to receive a third clock delayed from a second clock;

an edge detector configured to receive the first clock and the second clock, and provide a select signal to select the third clock,
wherein the edge detector provides the select signal based on the first clock and a fourth clock delayed from the second clock, wherein the fourth clock is delayed from the second clock by a delay time greater than a hold time of the first device.

14. The circuit of claim 13 wherein the fourth clock is delayed from the second clock by an amount relative to one or a combination of a hold time of the first device and jittering of the second clock.

15. The circuit of claim 13 wherein the edge detector provides the select signal based on an RC circuit charging a pulse generated from the first clock and the second clock.

16. The circuit of claim 15 wherein the select signal is provided based on a width of the pulse relative to one or a combination of the hold time of the first device and jittering of the second clock.

* * * * *